(12) United States Patent
Kim (10) Patent No.: US 10,247,778 B2
(45) Date of Patent: Apr. 2, 2019

(54) SEMICONDUCTOR APPARATUS AND TEST METHOD THEREOF

(71) Applicant: SK hynix Inc., Icheon-si Gyeonggi-do (KR)

(72) Inventor: Ki Up Kim, Icheon-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 773 days.

(21) Appl. No.: 14/862,661

(22) Filed: Sep. 23, 2015

(65) Prior Publication Data

US 2016/0011265 A1    Jan. 14, 2016

Related U.S. Application Data

(62) Division of application No. 13/162,726, filed on Jun. 17, 2011, now Pat. No. 9,170,302.

(30) Foreign Application Priority Data

Nov. 26, 2010 (KR) .................. 10-2010-0118787

(51) Int. Cl.
G11C 7/00 (2006.01)
G01R 31/3183 (2006.01)
G01R 31/3185 (2006.01)

(52) U.S. Cl.
CPC ........... *G01R 31/318335* (2013.01); *G01R 31/318513* (2013.01)

(58) Field of Classification Search
CPC .............. G01R 31/318335; G01R 31/318513

USPC ................................................. 365/201
See application file for complete search history.

(56) References Cited

U.S. PATENT DOCUMENTS

| | | | | | |
|---|---|---|---|---|---|
| 5,442,641 | A | * | 8/1995 | Beranger | G11C 29/40 714/719 |
| 5,557,619 | A | * | 9/1996 | Rapoport | G11C 29/14 714/718 |
| 5,571,029 | A | * | 11/1996 | Poissant | H01R 4/2433 439/412 |
| 5,745,500 | A | * | 4/1998 | Damarla | G01R 31/2884 714/30 |
| 5,836,392 | A | * | 11/1998 | Urlwin-Smith | C08F 220/12 166/295 |
| 5,867,644 | A | * | 2/1999 | Ranson | G06F 11/364 714/39 |
| 6,421,794 | B1 | * | 7/2002 | Chen | G11C 29/44 714/42 |
| 6,534,015 | B1 | * | 3/2003 | Viot | B01L 9/543 422/564 |
| 6,550,026 | B1 | * | 4/2003 | Wright | G11C 29/38 365/189.04 |
| 6,553,530 | B1 | * | 4/2003 | Kim | G01R 31/31813 714/728 |

(Continued)

*Primary Examiner* — Viet Q Nguyen
(74) *Attorney, Agent, or Firm* — William Park & Associates Ltd.

(57) ABSTRACT

A semiconductor apparatus includes first and second chips sharing first and second data channels. The first chip compresses first test data of the first chip and outputs the compressed first test data through the first data channel in a first test mode, and the second chip compresses second test data of the second chip and outputs the compressed second test data through the second data channel in the first test mode.

13 Claims, 5 Drawing Sheets

(56) References Cited

U.S. PATENT DOCUMENTS

| | | | | |
|---|---|---|---|---|
| 6,735,729 B1* | 5/2004 | Merritt | G11C 29/40 | 365/201 |
| 7,013,413 B1* | 3/2006 | Kim | G11C 7/1051 | 714/48 |
| 7,434,152 B2* | 10/2008 | Naso | G11C 29/40 | 714/718 |
| 7,596,729 B2* | 9/2009 | Adsitt | G01R 31/318335 | 365/201 |
| 7,760,199 B2* | 7/2010 | An | H03F 3/45219 | 345/204 |
| 8,024,627 B2* | 9/2011 | Song | G11C 29/1201 | 365/200 |
| 8,024,629 B2* | 9/2011 | Louie | G01R 31/318547 | 365/185.01 |
| 8,713,384 B2* | 4/2014 | Jeon | G06F 11/2273 | 714/718 |
| 8,867,287 B2* | 10/2014 | Cha | G11C 29/34 | 365/189.02 |
| 9,170,302 B2* | 10/2015 | Kim | G01R 31/318513 | |
| 9,330,786 B2* | 5/2016 | Uetake | G11C 29/40 | |
| 9,484,117 B2* | 11/2016 | Hsu | G11C 29/14 | |
| 2003/0110425 A1* | 6/2003 | Yun | G11C 29/40 | 714/718 |
| 2004/0246337 A1* | 12/2004 | Hasegawa | G01R 31/318536 | 348/189 |
| 2007/0168808 A1* | 7/2007 | Ong | G01R 31/31922 | 714/731 |
| 2011/0074031 A1* | 3/2011 | Zenner | H01L 24/05 | 257/751 |
| 2011/0093235 A1* | 4/2011 | Oh | G01R 31/2884 | 702/120 |
| 2011/0184688 A1* | 7/2011 | Uetake | G11C 29/40 | 702/120 |
| 2012/0092943 A1* | 4/2012 | Nishioka | G11C 16/20 | 365/191 |
| 2012/0136611 A1* | 5/2012 | Kim | G01R 31/318335 | 702/118 |
| 2012/0230137 A1* | 9/2012 | Lee | G11C 29/28 | 365/201 |
| 2014/0143620 A1* | 5/2014 | Jeon | G01R 31/31905 | 714/724 |
| 2014/0177365 A1* | 6/2014 | Kim | G11C 29/26 | 365/201 |
| 2015/0316605 A1* | 11/2015 | Deutsch | G01R 31/318547 | 702/117 |
| 2017/0285106 A1* | 10/2017 | Maeda | G01B 31/318335 | |
| 2018/0032252 A1* | 2/2018 | Yu | G06F 3/061 | |

\* cited by examiner

| | Chip Address Signal | |
|---|---|---|
| Chip1 | L | L |
| Chip2 | L | H |
| Chip3 | H | L |
| Chip4 | H | H |

SEMICONDUCTOR APPARATUS AND TEST METHOD THEREOF

CROSS-REFERENCE TO RELATED APPLICATION

The present application claims priority under 35 U.S.C. § 119(a) to Korean Patent Application No. 10-2010-0118787, filed on Nov. 26, 2010, in the Korean Intellectual Property Office, which is incorporated herein by reference in its entirety as if set forth in full.

BACKGROUND

1. Technical Field

Various embodiments of the present invention relates to a semiconductor apparatuses and related methods. In particular, certain embodiments relate to a semiconductor apparatus and a test method thereof.

2. Related Art

Semiconductor apparatuses are usually verified through various tests prior to shipment as the final products. In general, a compression test is performed to reduce the test time and improve the test efficiency. The compression test can considerably reduce the test time because it is performed by compressing a plurality of data stored at the same level and detecting the level of the compressed data.

In order to increase the integration density, a 3-dimensional (3D) semiconductor apparatus that has a plurality of chips stacked in a single package has recently been developed. The 3D semiconductor apparatus has vertically stacked two or more chips to implement the maximum integration density in the same space.

Various methods are used to implement the 3D semiconductor apparatus. One of the methods stacks a plurality of chips with the same structure and connects the stacked chips by metal lines or wires so that they operate as a single semiconductor apparatus.

A through-silicon via (TSV) method has recently been used. In a TSV method, all of the stacked chips are electrically connected by a silicon via penetrating the stacked chips. Because chips are stacked and connected by a silicon via penetrating the stacked chips, a TSV-based semiconductor apparatus can effectively reduce the package area as compared to a semiconductor apparatus that has a plurality of chips connected by wire interconnections around the edges of the chips.

Various compression test circuits and methods have been proposed for single-chip packaged semiconductor apparatuses. However, few compression test circuits and methods have been proposed for multi-chip packaged 3D semiconductor apparatuses.

SUMMARY

Accordingly, there is a need for an improved semiconductor apparatus and a test method thereof, which makes it possible to test a plurality of chips of the semiconductor apparatus on a chip-by-chip basis and to test the chips even after packaging.

To attain the advantages and in accordance with the purposes of the invention, as embodied and broadly described herein, one exemplary aspect of the present invention may provide a semiconductor apparatus comprising: first and second chips sharing first and second data channels, wherein the first chip compresses first test data of the first chip and outputs the compressed first test data through the first data channel in a first test mode, and the second chip compresses second test data of the second chip and outputs the compressed second test data through the second data channel in the first test mode.

In another exemplary aspect of the present invention, a semiconductor apparatus may comprise: a first data output unit connected to a first data channel; a second data output unit connected to a second data channel; and a compression test data generating unit configured to generate compression data in response to a chip selection signal and first and second test data and output the compression data to one of the first and second data output units, wherein the first data output unit outputs one of the first test data and the compression data through the first data channel in response to a control signal, and the second data output unit outputs one of the second test data and the compression data through the second data channel in response to the control signal.

In still another exemplary aspect of the present invention, a method for testing a semiconductor apparatus may comprise: compressing a plurality of data to generate first and second test data; compressing the first and second test data to generate compression data; and outputting one of the first test data and the compression data through a first data channel in response to a control signal.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

DETAILED DESCRIPTION

Reference will now be made in detail to the exemplary embodiments consistent with the present disclosure, examples of which are illustrated in the accompanying drawings. Wherever possible, the same reference characters will be used throughout the drawings to refer to the same or like parts.

Figure 1:
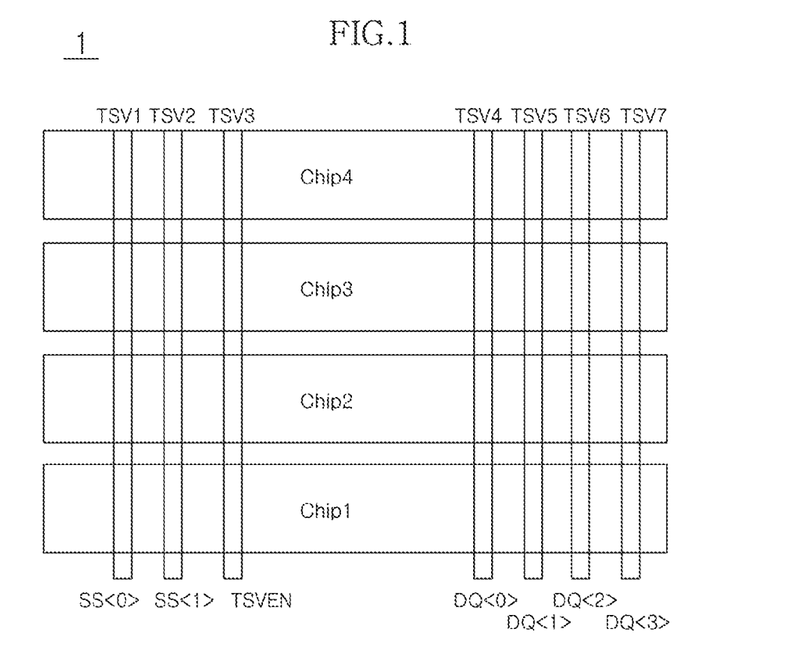
FIG. 1 is a diagram illustrating a semiconductor apparatus according to an exemplary embodiment of the present invention.

FIG. 1 is a diagram illustrating a semiconductor apparatus 1 according to an exemplary embodiment of the present invention. FIG. 1 illustrates a 3D semiconductor apparatus including four chips stacked and packaged as a single semiconductor apparatus. Although FIG. 1 illustrates that the semiconductor apparatus 1 includes four chips stacked, the number of the chips stacked should be considered in an illustrative purpose only and not intended to be limiting thereto. The first to fourth chips Chip1 to Chip4 are electrically connected to one another through a through-silicon via (TSV). The TSV are formed to penetrate the stacked first to fourth chips Chip1 to Chip4. The TSV may be filled with a conductive material to electrically connect the first to fourth chips Chip1 to Chip4.

Referring to FIG. 1, the first TSV TSV1 transmits a chip address signal SS<0> to the first to fourth chips Chip1 to Chip4. The second TSV TSV2 transmits a chip address signal SS<1> to the first to fourth chips Chip1 to Chip4. The third TSV TSV2 transmits a control signal TSVEN to the first to fourth chips Chip1 to Chip4. The control signal TSVEN may include a test mode signal and an MRS signal generated by a mode register set (MRS). The control signal TSVEN is used to set a first test mode and a second test mode, which will be described below in detail. Each of the fourth to seventh TSVs TSV4 to TSV7 corresponds to data channels DQ<0:3> of the first to fourth chips Chip1 to Chip4, respectively. Although FIG. 1 illustrates that there are four data channels DQ<0:3> and four TSVs TSV4 to TSV7 corresponding to the four data channels DQ<0:3>, the number of the data channels and the number of the TSVs corresponding to the data channels should be considered in an illustrative purpose only and not intended to be limiting thereto. The first to fourth chips Chip1 to Chip4 share the data channels DQ<0:3> through the fourth to seventh TSVs TSV4 to TSV7 that penetrate and connect the first to fourth chips Chip1 to Chip4. That is, data communication of the first to fourth chips Chip1 to Chip4 is performed through the fourth to seventh TSVs TSV4 to TSV7 in a shared manner. The structures of fourth TSV TSV4, the fifth TSV TSV5, the sixth TSV TSV6, and the seventh TSV TSV7 are substantially identical to that of the first data channel DQ<0>, the second data channel DQ<1>, the third data channel DQ<2>, and the fourth data channel DQ<3>, respectively. In the following description, the fourth TSV TSV4, the fifth TSV TSV5, the sixth TSV TSV6, and the seventh TSV TSV7 are also referred to as the first data channel DQ<0>, the second data channel DQ<1>, the third data channel DQ<2>, and the fourth data channel DQ<3>, respectively.

Figure 2:
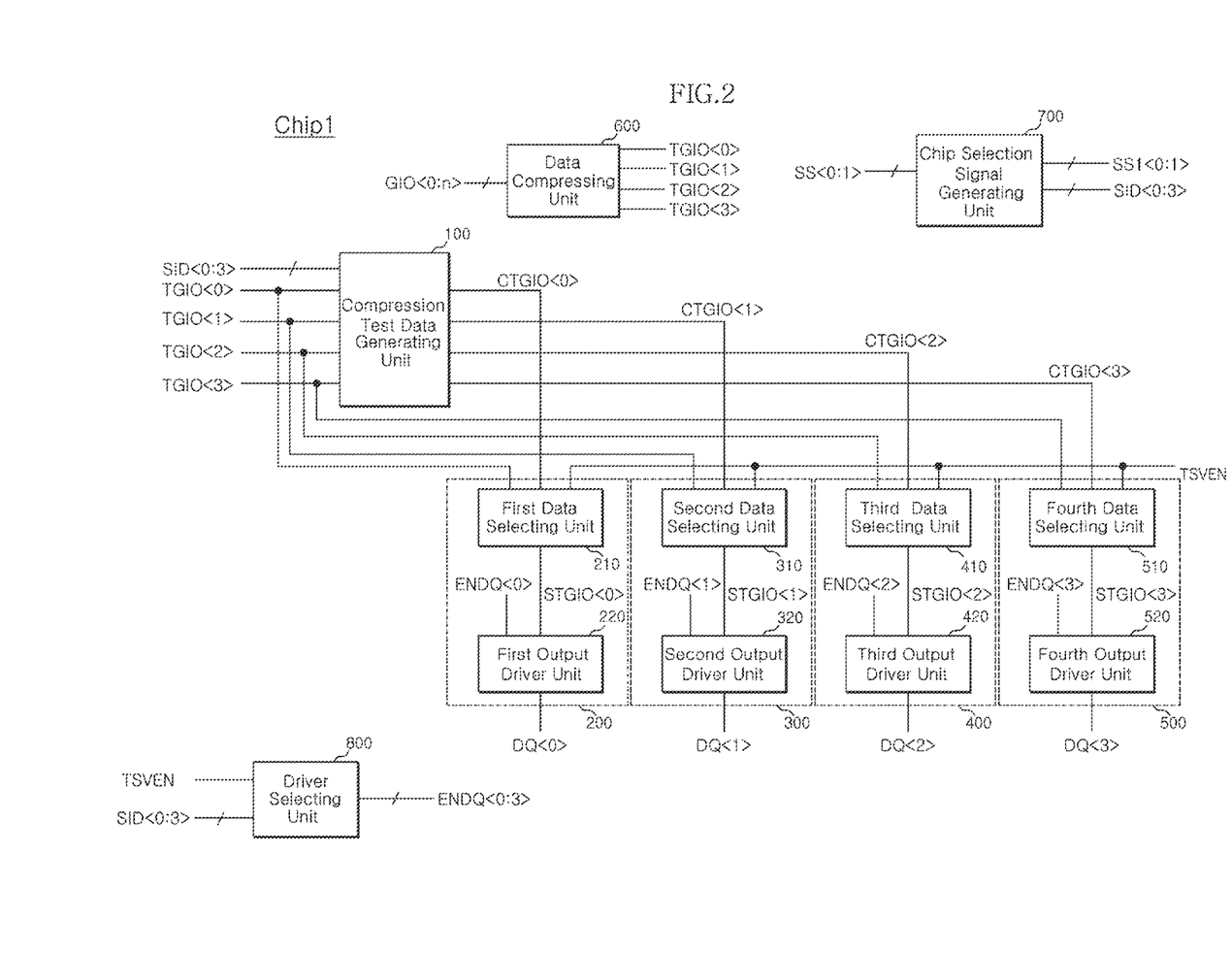
FIG. 2 is a diagram illustrating an exemplary embodiment of a first chip of the semiconductor apparatus illustrated in FIG. 1.

FIG. 2 is a diagram illustrating an exemplary embodiment of the first chip Chip1 of the semiconductor apparatus 1 illustrated in FIG. 1. The first to fourth chips Chip1 to Chip4 of the semiconductor apparatus 1 illustrated in FIG. 1 have substantially the same structure to lower the fabrication cost of the semiconductor apparatus. Each of the chips may alternatively include additional structures. Therefore, the configuration that the chips have the same structure should be considered in an illustrative purpose only and not intended to be limiting thereto.

Referring to FIG. 2, the first chip Chip1 may include a compression test data generating unit 100, a first data output unit 200, a second data output unit 300, a third data output unit 400, and a fourth data output unit 500. The compression test data generating unit 100 generates compression data CTGIO<0> of the first chip Chip1 in response to a chip selection signal SID<0:3> and first to fourth test data TGIO<0:3>. The compression test data generating unit 100 receives the chip selection signal SID<0:3> and the first to fourth test data TGIO<0:3> through first to fourth test input/output lines. The compression test data generating unit 100 compresses the first to fourth test data TGIO<0:3> and outputs the compression data CTGIO<0> of the first chip Chip1 to the first data output unit 200 in response to the chip selection signal SID<0:3>.

Since the compression test data generating unit 100 generates the compression data CTGIO<0> of the first chip Chip1 in response to the chip selection signal SID<0:3>, it does not generate compression data CTGIO<1> of the second chip Chip2, compression data CTGIO<2> of the third chip Chip3, and compression data CTGIO<3> of the fourth chip Chip4 illustrated in FIG. 2. Although not illustrated in FIG. 2, a compression test data generating unit of the second chip Chip2 is configured to generate compression data CTGIO<1> of the second chip Chip2 (instead of the compression data CTGIO<0> of the first chip Chip1) and output the compression data CTGIO<1> of the second chip Chip2 to a second data output unit of the second chip Chip2 in response to the chip selection signal SID<0:3>. Likewise, a compression test data generating unit of the third chip Chip3 is configured to generate compression data CTGIO<2> of the third chip Chip3 and output the compression data CTGIO<2> of the third chip Chip3 to a third data output unit of the third chip Chip3 in response to the chip selection signal SID<0:3>. Also, a compression test data generating unit of the fourth chip Chip4 is configured to generate compression data CTGIO<3> of the fourth chip Chip4 and output the compression data CTGIO<3> of the fourth chip Chip4 to a fourth data output unit of the fourth chip Chip4 in response to the chip selection signal SID<0:3>. As described above, since the first to fourth chips Chip 1 to Chip4 are fabricated to have the same structure, the second to fourth data output units 300 to 500 of the first chip Chip1 are also configured to receive the compression data CTGIO<1:3> of the second to fourth chips from the compression test data generating unit, respectively. However, since the compression test data generating unit 100 of the first chip Chip1 operates in response to the chip selection signal SID<0:3>, it generates only the compression data CTGIO<0> of the first chip Chip1 and outputs only the compression data CTGIO<0> of the first chip Chip1 to the first data output unit 200.

The first data output unit 200 receives the first test data TGIO<0> transmitted through the first test input/output line and the compression data CTGIO<0> of the first chip Chip1 generated by the compression test data generating unit 100, and outputs one of the first test data TGIO<0> and the compression data CTGIO<0> of the first chip Chip1 through the first data channel DQ<0> in response to the control signal TSVEN. The second data output unit 300 receives the second test data TGIO<1> through the second test input/output line and outputs the second test data TGIO<1> through the second data channel DQ<1> (the second data output unit 300 of the first chip Chip1 does not receive the compression data CTGIO<1> of the second chip, and the second data output unit of the second chip Chip2 receives the compression data CTGIO<1> of the second chip). The third data output unit 400 receives the third test data TGIO<2> through the third test input/output line and outputs the third test data TGIO<2> through the third data channel DQ<2> (the third data output unit 400 of the first chip Chip1 does not receive the compression data CTGIO<2> of the third chip, and the third data output unit of the third chip Chip3 receives the compression data CTGIO<2> of the third chip). The fourth data output unit 500 receives the fourth test data TGIO<3> through the fourth test input/output line and outputs the fourth test data TGIO<3> through the fourth data channel DQ<3> (the fourth data output unit 500 of the first chip Chip1 does not receive the compression data CTGIO<3> of the fourth chip, and the fourth data output unit of the fourth chip Chip4 receives the compression data CTGIO<3> of the fourth chip).

As described above, the control signal TSVEN is used to set the first and second test modes. In general, a test may be performed when chips are separately located on a wafer, or a test may be performed after chips are packaged as a single semiconductor apparatus. In an exemplary embodiment, the first test mode means a mode of performing a test after stacking and packaging the chips of the semiconductor apparatus to be connected through a TSV structure, and the second test mode means a mode of performing a test when the chips of the semiconductor apparatus are separately located on a wafer. Since the chips are tested independently or separately in the second test mode, a test can be normally performed even when the test data generated respectively by the chips are outputted respectively through the data channels. However, since the stacked chips share the data channel through a TSV structure in the first test mode, a test cannot be normally performed when the test data generated respectively by the chips are outputted respectively through the data channels. That is, sine the test data generated by the stacked chips are outputted through the shared data channel, accurate test results cannot be obtained because the levels of the data outputted are mixed. Thus, the semiconductor apparatus 1 according to an exemplary embodiment of the present invention is configured to output the test data TGIO<0:3> through the respective data channels DQ<0:3> in the second test mode in response to the control signal TSVEN, and to compress the test data TGIO<0:3> of the respective chips and output the compression data CTGIO<0:3> through the respective data channels DQ<0:3> in the first test mode. That is, in the first test mode, the compression data CTGIO<0> of the first chip is outputted through the first data channel DQ<0>, and the compression data CTGIO<1> of the second chip is outputted through the second data channel DQ<1>. Likewise, the compression data CTGIO<2:3> of the third and fourth chips are outputted respectively through the third and fourth data channels DQ<2:3>.

Referring to FIG. 2, the first data output unit 200 may include a first data selecting unit 210 and a first output driver unit 220. The first data selecting unit 210 receives the first test data TGIO<0> and the compression data CTGIO<0> of the first chip and outputs one of the first test data TGIO<0> and the compression data CTGIO<0> of the first chip in response to the control signal TSVEN. Hereinafter, the output of the first data selecting unit 210 is referred to as the first selection data STGIO<0>. The first output driver unit 220 receives the first selection data STGIO<0>, buffers the first selection data STGIO<0>, and outputs the same through the first data channel DQ<0>.

The second data output unit 300 may include a second data selecting unit 310 and a second output driver unit 320. The second data selecting unit 310 determines whether to output the second test data TGIO<1> in response to the control signal TSVEN. That is, since the second data selecting unit 310 does not receive the compression data CTGIO<1> of the second chip, it outputs the second test data TGIO<1> in response to the control signal TSVEN or outputs none of the second test data TGIO<1> and the compression data CTGIO<1> of the second chip. Hereinafter, the output of the second data selecting unit 310 is referred to as the second selection data STGIO<1>. The second output driver unit 320 receives the second selection data STGIO<1>, buffers the second selection data STGIO<1>, and outputs the same through the second data channel DQ<1>.

The third data output unit 400 may include a third data selecting unit 410 and a third output driver unit 420. The third data selecting unit 410 determines whether to output the third test data TGIO<2> in response to the control signal TSVEN. That is, since the third data selecting unit 410 does not receive the compression data CTGIO<2> of the third chip, it outputs the third test data TGIO<2> in response to the control signal TSVEN or outputs none of the third test data TGIO<2> and the compression data CTGIO<2> of the third chip. Hereinafter, the output of the third data selecting unit 410 is referred to as the third selection data STGIO<2>. The third output driver unit 420 receives the third selection data STGIO<2>, buffers the third selection data STGIO<2>, and outputs the same through the third data channel DQ<2>.

The fourth data output unit 500 may include a fourth data selecting unit 510 and a fourth output driver unit 520. The fourth data selecting unit 510 determines whether to output the fourth test data TGIO<3> in response to the control signal TSVEN. That is, since the fourth data selecting unit 510 does not receive the compression data CTGIO<3> of the fourth chip, it outputs the fourth test data TGIO<3> in response to the control signal TSVEN or outputs none of the fourth test data TGIO<3> and the compression data CTGIO<3> of the fourth chip. Hereinafter, the output of the fourth data selecting unit 510 is referred to as the fourth selection data STGIO<3>. The fourth output driver unit 520 receives the fourth selection data STGIO<3>, buffers the fourth selection data STGIO<3>, and outputs the same through the fourth data channel DQ<3>.

Referring to FIG. 2, the semiconductor apparatus 1 may further include a data compressing unit 600 that is configured to generate the first to fourth test data TGIO<0:3>. The data compressing unit 600 compress a plurality of data GIO<0:n> of the first chip Chip1, generates the first to fourth test data TGIO<0:3>, and outputs the first to fourth test data TGIO<0:3> through the first to fourth test input/output lines. Thus, the first to fourth test data TGIO<0:3> are generated by compressing the data GIO<0:n> of the first chip Chip1, and the compression data CTGIO<0> of the first chip Chip1 are generated by compressing the first to fourth test data TGIO<0:3>.

Referring to FIG. 2, the semiconductor apparatus 1 may further include a chip selection signal generating unit 700 that is configured to receive a chip address signal SS<0:1> and generate the chip selection signal SID<0:3> and a conversion address signal SS1<0:1>. The chip selection signal generating unit 700 transmits the conversion address signal SS1<0:1>, generated from the chip address signal SS<0:1>, to the second chip Chip2 through the first and second TSVs TSV1, TSV2, and generates the chip selection signal SID<0:1> from the chip address signal SS<0:1>. Since the semiconductor apparatus 1 includes the first to fourth chips Chip1 to Chip4, the chip selection signal SID<0:3> has 4 bits to select the first to fourth chips Chip1 to Chip4. The chip selection signal generating unit 700 receives the 2-bit chip address signal SS<0:1> to generate the 4-bit chip selection signal SID<0:3>. Thus, the chip selection signal generating unit 700 decodes the chip address signal SS<0:1> to generate the chip selection signal SID<0:3>. The first bit SID<0> of the chip selection signal is used to select the first chip Chip1, and the second to fourth bits SID<1:3> are used to select the second to fourth chips Chip2 to Chip4, respectively.

Referring to FIG. 2, the semiconductor apparatus 1 may further include a driver selecting unit 800. The driver selecting unit 800 receives the control signal TSVEN and the chip selection signal SID<0:3> and generates a driver enable signal ENDQ<0:3>. The driver selecting unit 800 generates the driver enable signal ENDQ<0:3> for controlling whether to enable the first to fourth output driver units 220, 320, 420 and 520 in response to the control signal TSVEN and the chip selection signal SID<0:3>. The driver enable signal ENDQ<0:3> has four bits to control whether to enable the first to fourth output driver units 220, 320, 420 and 520.

Figure 3:
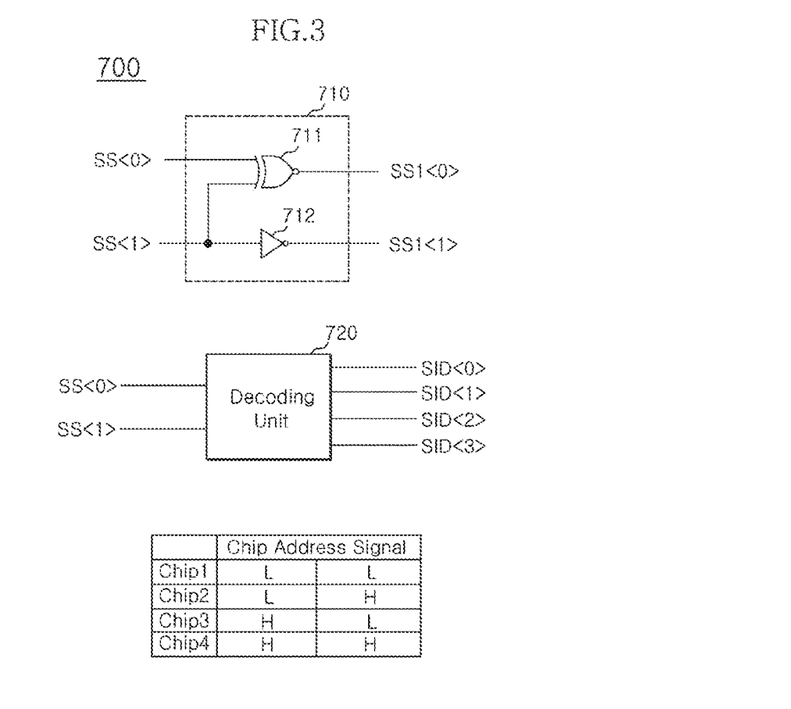
FIG. 3 is a diagram illustrating an exemplary embodiment of a chip selection signal generating unit illustrated in FIG. 2.

FIG. 3 is a diagram illustrating an exemplary embodiment of the chip selection signal generating unit 700 illustrated in FIG. 2.

Referring to FIG. 3, the chip selection signal generating unit 700 may include a conversion address generating unit 710 and a decoding unit 720. The conversion address generating unit 710 receives the chip address signal SS<0:1> and generates the conversion address signal SS1<0:1>. The conversion address generating unit 710 may include an XOR gate 711 and an inverter 712. The XOR gate 711 receives two bits SS<0:1> of the chip address signal and generates the first bit SS1<0> of the conversion address signal. The inverter 712 inverts the second bit SS<1> of the chip address signal and generates the second bit SS1<1> of the conversion address signal. The conversion address signal SS1<0:1> is transmitted through the first and second TSVs TSV1 and TSV2 and is inputted into a conversion address generating unit of the second chip Chip2. The conversion address generating unit of the second chip Chip2 has the same structure as the conversion address generating unit of the first chip Chip1, and generates another conversion address signal. The conversion address generating units of the third and fourth chips Chip3 and Chip4 have the same configuration as the conversion address generating unit of the first chip Chip1. According to the above configuration, like a table illustrated in FIG. 3, the first chip Chip1 receives the chip address signal SS<0:1> having two bits of a low level. The second chip Chip2 receives the chip address signal having the first bit of a low level and the second bit of a high level, that is, the conversion address signal SS1<0:1> generated by the conversion address generating unit 710. The third chip Chip3 receives the chip address signal having the first bit of a high level and the second bit of a low level. The fourth chip Chip4 receives the chip address signal having the first bit of a high level and the second bit of a high level. Thus, since the chip selection signal generating units of the first to fourth chips Chip1 to Chip4 receive the chip address signals having the bits of different levels, they may generate the chip selection signal SID<0:3> to select one of the first to fourth chips Chip1 to Chip4.

The decoding unit 720 receives the chip address signal SS<0:1> and generates the chip selection signal SID<1:3>. Since the decoding unit 720 receives the chip address signal SS<0:1> having two bits of a low level, it may activate the first bit SID<0> of the chip selection signal to a high level and deactivate the second to fourth bits SID<1:3> to a low level. Thus, the chip selection signal SID<0:3> is used to select and enable the first chip Chip1. Likewise, since the decoding units of the second to fourth chips Chip2 to Chip4 activate the second to fourth bits SID<1:3>, they may select and enable the second to fourth chips Chip2 to Chip4, respectively.

Figure 4:
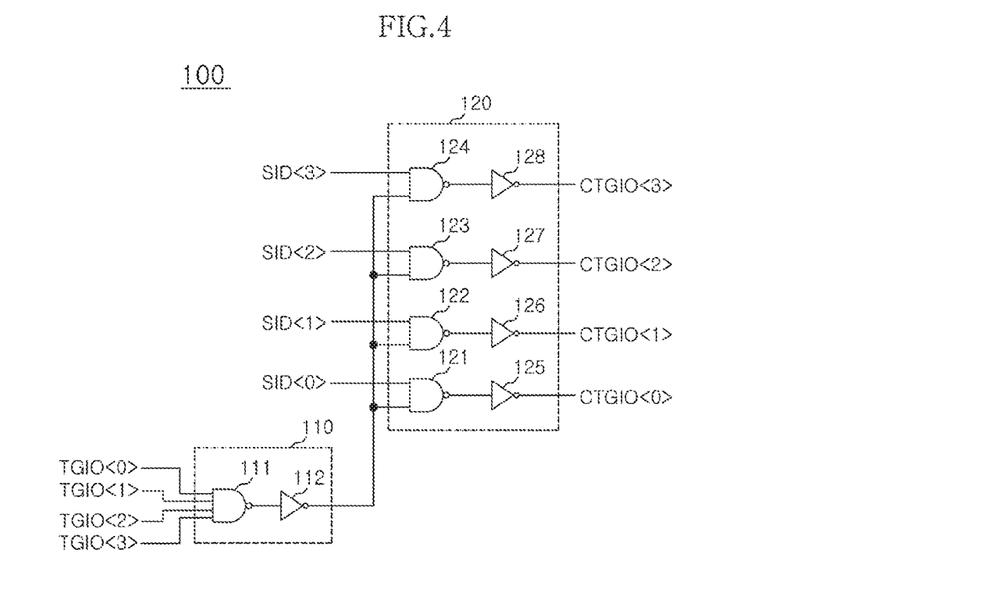
FIG. 4 is a diagram illustrating an exemplary embodiment of a compression test data generating unit illustrated in FIG. 2.

FIG. 4 is a diagram illustrating an exemplary embodiment of the compression test data generating unit 100 illustrated in FIG. 2.

Referring to FIG. 4, the compression test data generating unit 100 may include a compressing unit 110 and a compression data transmitting unit 120. The compressing unit 110 compresses the first to fourth test data TGIO<0:3> received through the first to fourth test input/output lines. The compressing unit 110 compresses the first to fourth test data TGIO<0:3> and generates the compression data CTGIO<0> of the first chip. As described above, the second to fourth chips Chip2 to Chip4 also have the same compressing unit. The compressing unit of the second chip Chip2 generates the compression data CTGIO<1> of the second chip by compressing the test data transmitted through the first to fourth test input/output lines of the second chip Chip2. The compressing unit of the third chip Chip3 generates the compression data CTGIO<2> of the third chip by compressing the test data transmitted through the first to fourth test input/output lines of the third chip Chip3. The compressing unit of the fourth chip Chip4 generates the compression data CTGIO<3> of the fourth chip by compressing the test data transmitted through the first to fourth test input/output lines of the fourth chip Chip4.

Referring to FIG. 4, the compressing unit 110 includes a NAND gate 111 and an inverter 112. The NAND gate 111 receives the first to fourth test dada TGIO<0:3>. The inverter 112 inverts the output of the NAND gate 111 and generates the compression data CTGIO<0> of the first chip. Thus, when all of the test data are at a high level, the compressing unit 110 may output high-level compression data.

The compression data transmitting unit 120 outputs the compression data CTGIO<0> of the first chip, generated by the compressing unit 110, to the first data output unit 200 in response to the chip selection signal SID<0:3>. The compression data transmitting unit 120 includes a NAND gate 121 configured to receive the first bit SID<0> of the chip selection signal and the compression data CTGIO<0> of the first chip, a NAND gate 122 configured to receive the second bit SID<1> of the chip selection signal and the compression data CTGIO<0> of the first chip, a NAND gate 123 configured to receive the third bit SID<2> of the chip selection signal and the compression data CTGIO<0> of the first chip, and a NAND gate 124 configured to receive the fourth bit SID<3> of the chip selection signal and the compression data CTGIO<0> of the first chip. Also, the compression data transmitting unit 120 includes inverters 125 to 128 configured to invert the outputs of the NAND gates 121 to 124. In the first chip Chip1, since the chip selection signal generating unit 700 activates the first bit SID<0> of the chip selection signal and deactivates the second to fourth bits SID<1:3>, only the NAND gate 121 and the inverter 125 may output the high-level compression data CTGIO<0> of the first chip. Thus, the compression test data generating unit 100 may output the compression data CTGIO<0> of the first chip to the first data output unit 200 in response to the chip selection signal SID<0:3>.

The compression data transmitting unit of the second chip Chip2 outputs the compression data CTGIO<1> of the second chip to the second data output unit of the second chip Chip2 in response to the chip selection signal SID<0:3>. The compression data transmitting unit of the third chip Chip3 outputs the compression data CTGIO<2> of the third chip to the third data output unit of the third chip Chip3 in response to the chip selection signal SID<0:3>. The compression data transmitting unit of the fourth chip Chip4 outputs the compression data CTGIO<3> of the fourth chip to the fourth data output unit of the fourth chip Chip4 in response to the chip selection signal SID<0:3>.

Figure 5:
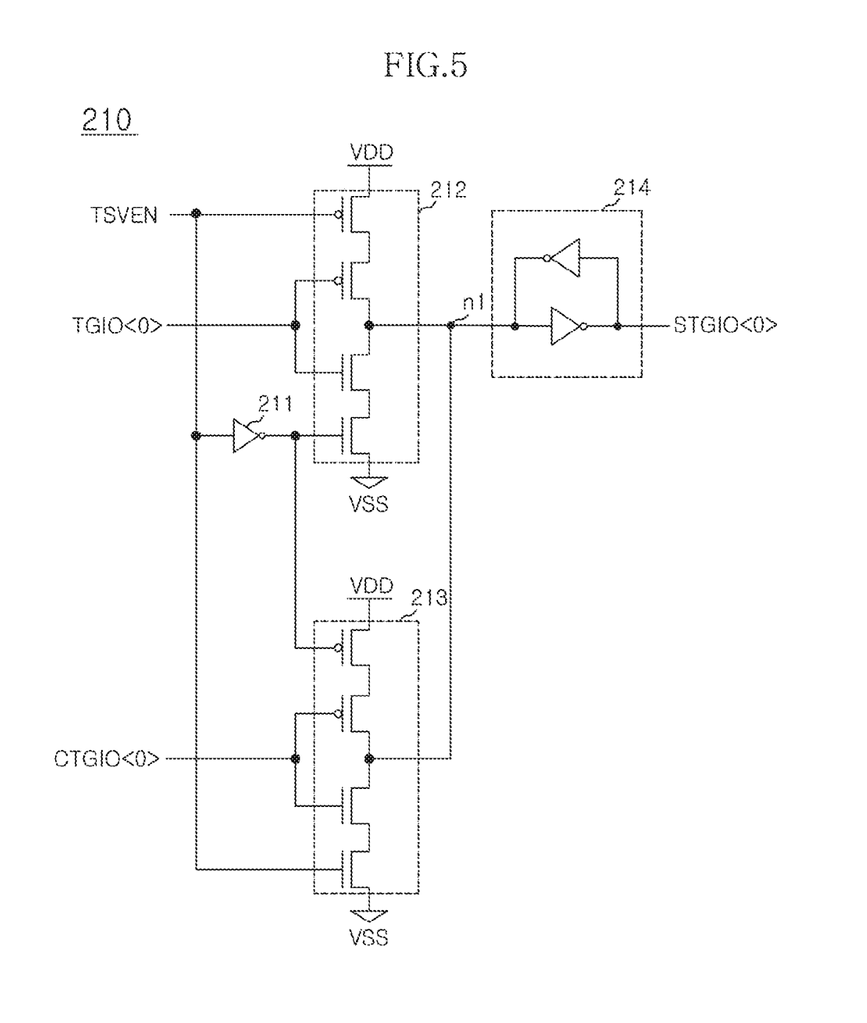
FIG. 5 is a diagram illustrating an exemplary embodiment of a first data selecting unit illustrated in FIG. 2.

FIG. 5 is a diagram illustrating an exemplary embodiment of the first data selecting unit 210 illustrated in FIG. 2.

Referring to FIG. 5, the first data selecting unit 210 may include a first inverter 211, first and second 3-state inverters 212 and 213, and a latch unit 214. The first inverter 211 inverts the control signal TSVEN. According to the control signal TSVEN and the output of the first inverter 211, the first 3-state inverter 212 inverts the first test data TGIO<0> and outputs the result to a common node n1 when the control signal TSVEN is at a low level. According to the control signal TSVEN and the output of the first inverter 211, the second 3-state inverter 213 inverts the compressing data CTGIO<0> of the first chip and outputs the result to the common node n1 when the control signal TSVEN is at a high level. The latch unit 214 inverts/stores the outputs of the first and second 3-state inverters 212 and 213 outputted to the common node n1, and outputs the inverted data as the first selection data STGIO<0>. Thus, the first data selecting unit 210 is configured to output the first test data TGIO<0> in the second test mode (i.e., when the control signal TSVEN is at a low level) and to output the compression data CTGIO<0>, generated by compressing the first to fourth test data TGIO<0:3>, as the first selection data STGIO<0> in the first test mode (i.e., when the control signal TSVEN is at a high level. The second to fourth data selecting units 310, 410 and 510 have the same configuration as the first data selecting unit 210. However, the second to fourth data selecting units 310, 410 and 510 of the first chip Chip1 output the second to fourth test data TGIO<1:3> as the second to fourth selection data STGIO<1:3> in the second test mode, but do not output any data in the first test mode because they do not receive the second to fourth compression data CTGIO<1:3>.

Although not illustrated in the drawings, the first to fourth data selecting units of the second chip Chip2 output the first to fourth test data as the first to fourth selection data in the second test mode. In the first test mode, the second data selecting unit outputs the compression data CTGIO<1> of the second chip as the second selection data, and the first, third and fourth data selecting units do not output any data.

Also, the first to fourth data selecting units of the third chip Chip3 output the first to fourth test data as the first to fourth selection data in the second test mode. In the first test mode, the third data selecting unit outputs the compression data CTGIO<2> of the third chip as the third selection data, and the first, second and fourth data selecting units do not output any data.

Also, the first to fourth data selecting units of the fourth chip Chip4 output the first to fourth test data as the first to fourth selection data in the second test mode. In the first test mode, the fourth data selecting unit outputs the compression data CTGIO<3> of the fourth chip as the fourth selection data, and the first, second and third data selecting units do not output any data.

Figure 6:
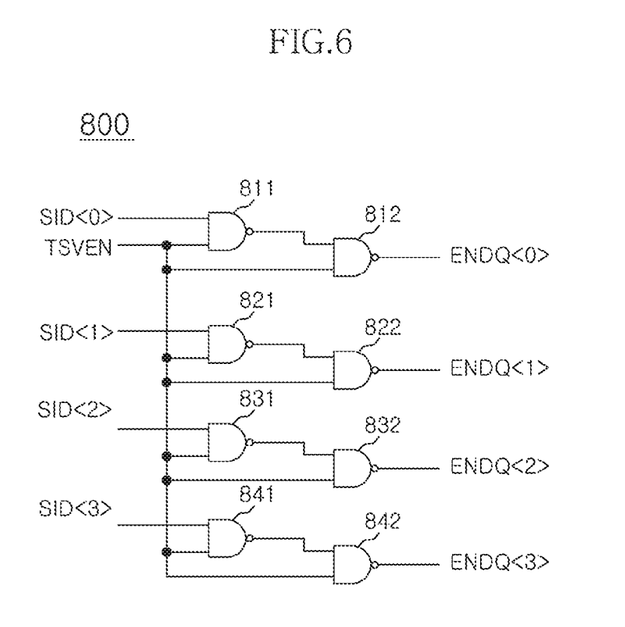
FIG. 6 is a diagram illustrating an exemplary embodiment of a driver selecting unit illustrated in FIG. 2.

FIG. 6 is a diagram illustrating an exemplary embodiment of the driver selecting unit 800 illustrated in FIG. 2.

Referring to FIG. 6, the driver selecting unit 800 includes first to eighth NAND gates 811, 812, 821, 822, 831, 832, 841 and 842. The first NAND gate 811 receives the control signal TSVEN and the first bit SID<0> of the chip selection signal. The second NAND gate 812 receives the control signal TSVEN and the output of the first NAND gate 811 and generates the first bit ENDQ<0> of the driver enable signal. The third NAND gate 821 receives the control signal TSVEN and the second bit SID<1> of the chip selection signal. The fourth NAND gate 822 receives the control signal TSVEN and the output of the third NAND gate 821 and generates the second bit ENDQ<1> of the driver enable signal. The fifth NAND gate 831 receives the control signal TSVEN and the third bit SID<2> of the chip selection signal. The sixth NAND gate 832 receives the control signal TSVEN and the output of the fifth NAND gate 831 and generates the third bit ENDQ<2> of the driver enable signal. The seventh NAND gate 841 receives the control signal TSVEN and the fourth bit SID<3> of the chip selection signal. The eighth NAND gate 842 receives the control signal TSVEN and the output of the seventh NAND gate 841 and generates the fourth bit ENDQ<3> of the driver enable signal. Thus, in the first test mode, that is, when the control signal TSVEN is activated to a high level, since only the first bit SID<0> of the chip selection signal SID<0:3> generated by the chip selection signal generating unit 700 of the first chip Chip1 is activated to a high level, the first bit ENDQ<0> of the driver enable signal is activated to a high level and the second to fourth bits ENDQ<1:3> are deactivated to a low level. Thus, only the first output driver unit 220 receiving the first bit ENDQ<0> of the driver enable signal is enabled in the first test mode. However, in the second test mode, since the control signal TSVEN is deactivated to a low level, all the bits ENDQ<0:3> of the driver enable signal are activated to a high level to enable all of the first to fourth output driver units 220, 320, 420 and 520.

An operation of the semiconductor apparatus 1 according to an exemplary embodiment of the present invention will be described below with reference to FIGS. 1 to 6.

First, when the chip address signal SS<0:1> is transmitted to the first chip Chip1 through the first and second TSVs TSV1 and TSV2, the chip selection signal generating unit 700 generates the conversion address signal SS1<0:1>, transmits the same to the second chip Chip2, and activates the first bit SID<0> of the chip selection signal to a high level. The chip selection signal generating unit of the second chip Chip2 receives the conversion address signal SS1<0:1> from the first chip Chip1, generates another conversion address signal, transmits the same to the third chip Chip3, and activates the second bit SID<1> of the chip selection signal to a high level. The chip selection signal generating units of the third and fourth chip Chip3 and Chip4 enable the third and fourth bits SID<2:3> to a high level.

The first to fourth test input/output lines of the first to fourth chips Chip1 to Chip4 transmit the first to fourth test data, respectively. The compression test data generating unit 100 of the first chip Chip1 compresses the first to fourth test data TGIO<0:3>, generates the compression data CTGIO<0> of the first chip, and outputs the compression data CTGIO<0> of the first chip to the first data selecting unit 210 in response to the first bit SID<0> of the chip selection signal activated to a high level.

Herein, if the control signal TSVEN is at a high level, the semiconductor apparatus 1 operates in the first test mode and the driver selecting unit 800 activates the first bit ENDQ<0> of the driver enable signal to a high level. The first data selecting unit 210 outputs the compression data CTGIO<0> of the first chip (among the first test data TGIO<0> and the compression data CTGIO<0> of the first chip) in response to the control signal TSVEN, and enables only the first output driver unit 220 (among the first to fourth output driver units 220, 320, 420 and 520) in response to the driver enable signal ENDQ<0>. Thus, the first output driver unit 220 outputs the compression data CTGIO<0> of the first chip, outputted from the first data selecting unit 210, through the first data channel DQ<0>.

In the same manner as the first chip Chip1, the second to fourth chips Chip2 to Chip4 output the compression data CTGIO<1:3> of the second to fourth chips, generated from the respective compression test data, through the second to fourth data channels DQ<1:3>. Thus, the first to fourth chips Chip1 to Chip4 can be tested simultaneously and normally because the compression data CTGIO<0:3> of the first to fourth chips are outputted respectively through the first to fourth data channels DQ<0:3>.

If the control signal TSVEN is at a low level, the semiconductor apparatus 1 operates in the second test mode and the driver selecting unit 800 activates all the bits ENDQ<0:3> of the driver enable signal to a high level. The first data selecting unit 210 outputs the first test data TGIO<0> (among the first test data TGIO<0> and the compression data CTGIO<0> of the first chip) in response to the control signal TSVEN, and the first output driver unit 220 outputs the first test data TGIO<0> through the first data channel DQ<0>. The second to fourth output driver units 320, 420 and 520 output the second to fourth test data TGIO<1:3>, outputted from the second to fourth data selecting units 310, 410 and 510, through the second to fourth data channels DQ<1:3>. Thus, the first to fourth test data TGIO<0:3> of the first chip Chip1 can be outputted through the first to fourth data channels DQ<0:3>, and a test operation can be performed on the first chip Chip1. The same may be said of the second to fourth chips Chip2 to Chip4.

Thus, the semiconductor apparatus 1 outputs the compression data of the respective chips through the data channels in the second test mode, thereby making it possible to test the chips on a chip-by-chip basis. Also, the semiconductor apparatus 1 compresses the compression data of the respective chips in the first test mode and outputs the compression data of the respective chips through the respective data channels to perform a test operation. Accordingly, the compression test of the stacked chips can be performed even when the chips are stacked and packaged as a single semiconductor apparatus.

While certain embodiments have been described above, it will be understood to those skilled in the art that the embodiments described are by way of example only. Accordingly, the semiconductor apparatus and the test method thereof described herein should not be limited based on the described embodiments. Rather, the semiconductor apparatus and the test method thereof described herein should only be limited in light of the claims that follow when taken in conjunction with the above description and accompanying drawings.

What is claimed is:

1. A semiconductor apparatus comprising:
   a first data output unit connected to a first data channel;
   a second data output unit connected to a second data channel; and
   a compression test data generating unit configured to generate compression data in response to a chip selection signal and first and second test data and output the compression data to one of the first and second data output units,
   wherein the first data output unit outputs one of the first test data and the compression data through the first data channel in response to a control signal, and the second data output unit outputs one of the second test data and the compression data through the second data channel in response to the control signal.

2. The semiconductor apparatus according to claim 1, further comprising a data compressing unit configured to compress a plurality of data and generate the first and second test data.

3. The semiconductor apparatus according to claim 1, wherein the first data output unit comprises:
   a first data selecting unit configured to output one of the first test data and the compression data in response to the control signal; and
   a first output driver unit configured to receive the output of the first data selecting unit and output the same through the first data channel.

4. The semiconductor apparatus according to claim 3, wherein the second data output unit comprises:
   a second data selecting unit configured to output one of the second test data and the compression data in response to the control signal; and
   a second output driver unit configured to receive the output of the second data selecting unit and output the same through the second data channel.

5. The semiconductor apparatus according to claim 4, wherein further comprising a driver selecting unit configured to generate a driver control signal for controlling whether to enable the first and second output driver units in response to the control signal and the chip selection signal.

6. The semiconductor apparatus according to claim 1, wherein the compression test data generating unit comprises:
   a compressing unit configured to compress the first and second test data and generate the compression data; and
   a compression data transmitting unit configured to output the compression data to one of the first data output unit and the second data output unit in response to the chip selection signal.

7. The semiconductor apparatus according to claim 1, further comprising a chip selection signal generating unit configured to receive a chip address signal and generate the chip selection signal.

8. A method for testing a semiconductor apparatus, comprising the steps of:
   compressing a plurality of data to generate first and second test data;
   compressing the first and second test data to generate compression data; and
   outputting one of the first test data and the compression data through a first data channel in response to a control signal which sets a first test mode and a second test mode.

9. The method according to claim 8, further comprising the step of receiving a chip address signal to generate a chip selection signal,
   wherein the step of compressing the first and second test data to generate the compression data is performed in response to the chip selection signal.

10. The method according to claim 8, wherein the step of outputting one of the first test data and the compression data through the first data channel in response to the control signal comprises the steps of:
    outputting the compression data in the first test mode in respond to the control signal; and
    outputting the first test data in the second test mode in response to the control signal.

11. The method according to claim 8, further comprising the step of outputting the second test data through a second data channel in the second test mode in response to the control signal.

12. The method according to claim 8, wherein the output of the second test data through the second data channel is interrupted in the first test mode in response to the chip selection signal.

13. The method according to claim 8, wherein the output of the second test data through the second data channel is interrupted in the first test mode in response to the control signal.

\* \* \* \* \*